United States Patent
Hsuan et al.

(10) Patent No.: US 7,534,653 B2
(45) Date of Patent: May 19, 2009

(54) CHIP PACKAGING PROCESS

(75) Inventors: Min-Chih Hsuan, Hsinchu (TW);
Kai-Kuang Ho, Hsinchu (TW);
Kuo-Ming Chen, Hsinchu (TW);
Kuang-Hui Tang, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 87 days.

(21) Appl. No.: 11/563,514

(22) Filed: Nov. 27, 2006

(65) Prior Publication Data
US 2007/0085206 A1 Apr. 19, 2007

Related U.S. Application Data

(62) Division of application No. 10/810,436, filed on Mar. 25, 2004.

(51) Int. Cl.
*H01L 21/00* (2006.01)
(52) U.S. Cl. .......................... 438/108; 257/778; 257/704
(58) Field of Classification Search ................. 438/667, 438/108
See application file for complete search history.

(56) References Cited

U.S. PATENT DOCUMENTS 6,323,550 B1 * 11/2001 Martin et al. ............... 257/704
6,727,116 B2 * 4/2004 Poo et al. .................... 438/106

* cited by examiner

*Primary Examiner*—Thao X Le
*Assistant Examiner*—Ajay K Arora
(74) *Attorney, Agent, or Firm*—J.C. Patents (57) ABSTRACT

A chip packaging process includes providing a wafer, having an active surface and a backside. The wafer has a first chip area and a second chip area adjacent to the first chip area. The wafer has several first and second bond pads on the active surface in the first and second chip areas respectively. Several through holes are formed on the wafer. The through holes pass through the wafer and connect the active surface and the backside. The through. holes are arranged between the first chip area and the second chip area. Several connecting lines are formed on peripheral surfaces of the through holes. Each of the connecting lines has a first end portion extending on the active surface and a second portion extending on the backside. Each the first end portion is electrically connected to one of the first bond pads and one of the second bond pads.

10 Claims, 9 Drawing Sheets

CHIP PACKAGING PROCESS

CROSS-REFERENCE TO RELATED APPLICATION

This application is a divisional application of a prior application Ser. No. 10/810,436, filed Mar. 25, 2004. The prior application Ser. No. 10/810,436, has a foreign application of Taiwan application serial no. 93105477, filed on Mar. 3, 2004.

BACKGROUND OF THE INVENTION

1. Field of the Invention

This invention generally relates to a chip package and a process thereof, and more particularly to a chip package having a rigid cover on the active surface of the chip and a process thereof.

2. Description of Related Art

In the semiconductor industry, integrated circuit (IC) manufacturing includes 3 steps—design, process, and packaging. Chips are manufactured by the steps of making wafer, designing the circuit, making the mask, cutting the wafer and so on. Each chip is electrically connected to the external circuit via the bond pads on the chip. Then the insulating material is optionally used to package the chip. The purposes of packaging are to protect the chip from moisture, heat and noise, and to provide the electrical connection between the chip and the external circuit such as printed circuit board (PCB) or other carriers.

As the IC packaging technology advances, the package is getting smaller. Among the IC packaging types, chip scale package (CSP) is one of the package technologies that the length of the package is smaller than 1.2 times of the length of the chip inside the package, or (the chip area/package area) is smaller than 80% while the pitch of the pins of the package is smaller than 1 mm. Based on the material and the structures, CSP includes rigid interposer type, flex interposer type, custom lead frame type, wafer level type and so on.

Unlike the packaging technology for single chip, the wafer level package focuses on packaging wafer in order to simplify the chip packaging process. Hence, after the integrated circuits have been manufactured on the wafer, the whole wafer can be packaged. Then the wafer cutting can be performed to form a plurality of chips from the wafer.

SUMMARY OF THE INVENTION

An object of the present invention is to provide a chip package having a better structural strength, thermal conductive efficiency, and anti-electromagnetic interference ability.

Another object of the present invention is to provide a chip packaging process using wafer level package technology in order to provide a better structural strength, thermal conductive efficiency, and anti-electromagnetic interference ability.

The present invention provides a chip packaging process, comprising providing a wafer, having an active surface and a backside corresponding to the active surface. The wafer has a first chip area and a second chip area adjacent to the first chip area. The wafer has several first and second bond pads on the active surface in the first and second chip areas respectively. Several through holes are formed on the wafer. The through holes pass through the wafer and connect the active surface and the backside. The through holes are arranged between the first chip area and the second chip area. Several connecting lines are formed on peripheral surfaces of the through holes. Each of the connecting lines has a first end portion extending on the active surface. Each the first end portion is electrically connected to one of the first bond pads and one of the second bond pads.

According to the chip package of the packaging process, a rigid cover is disposed on the active surface of the chip to protect the active surface of the chip and enhance the structural strength of the chip package. Further, if the material of the rigid cover is a thermal conductive material such as Cu or Al alloy, the heat-spread ability of the chip package can be enhanced. If the rigid cover is made of an electrical. conductive material and electrically connected to the ground of the chip package, the electromagnetic interference (EMI) to the chip package can be reduced. It should be noted that the chip packaging process could form a plurality of the terminal pads on the backside of the chip so that the chip package can be connected to the PCB or substrate via these terminal pads.

The above is a brief description of some deficiencies in the prior art and advantages of the present invention. Other features, advantages and embodiments of the invention will be apparent to those skilled in the art from the following description, accompanying drawings and. appended claims.

DESCRIPTION OF THE PREFERRED EMBODIMENTS

Figure 1A:
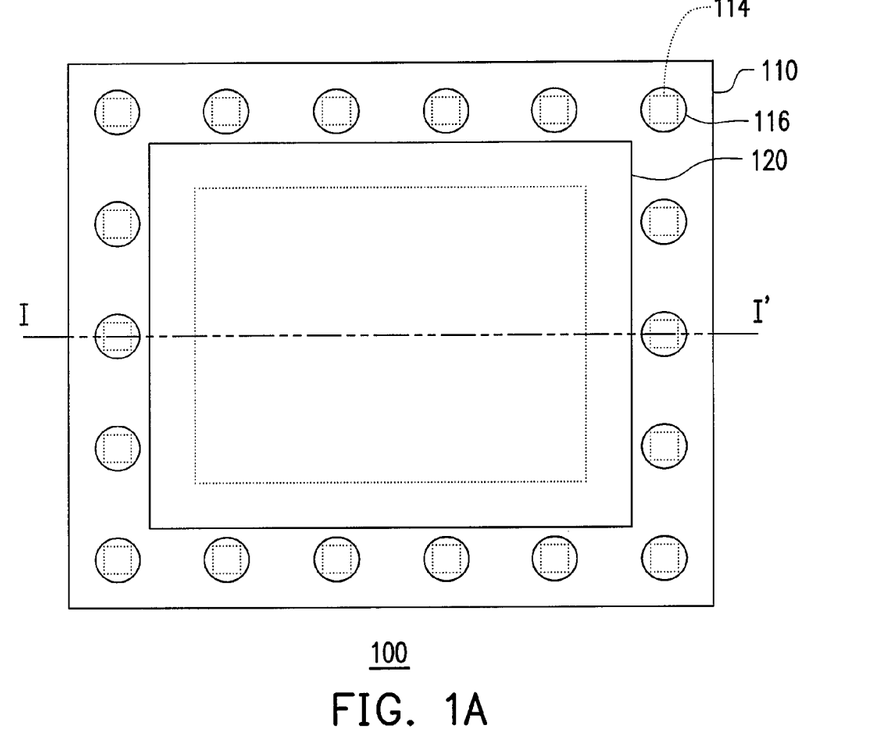
FIG. 1A is a top view of the first chip package in accordance with the first embodiment of the present invention.
Figure 1B:
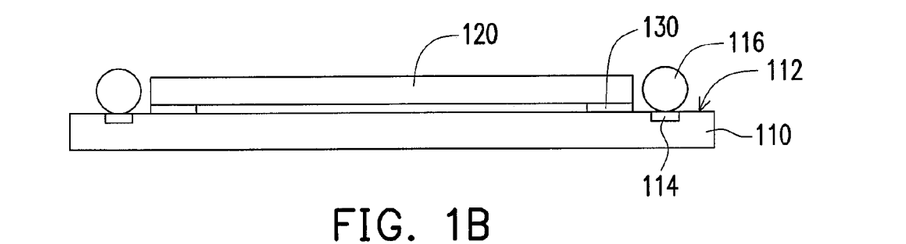
FIG. 1B is a cross-sectional view of the first chip package of FIG. 1A along I-I' line.

FIG. 1A is a top view of the first chip package in accordance with the first embodiment of the present invention. FIG. 1B is a cross-sectional view of the first chip package of FIG. 1A along I-I' line. Referring to FIGS. 1A and 1B, the chip package 100 includes a chip 110, a rigid cover 120, and an adhesive layer 130. The chip 110 is one of a plurality of uncut chips of the wafer (not shown). The chip 110 has a rectangular shape having an active surface 112 and a plurality of bond pads 114. The bond pads 114 are disposed on the circumference of the active surface 112. The periphery of the rigid cover 120 is adhered to the active surface 112 via the adhesive layer 130. The bond pads 114 are disposed outside the periphery of the rigid cover 120.

Figure 1C:
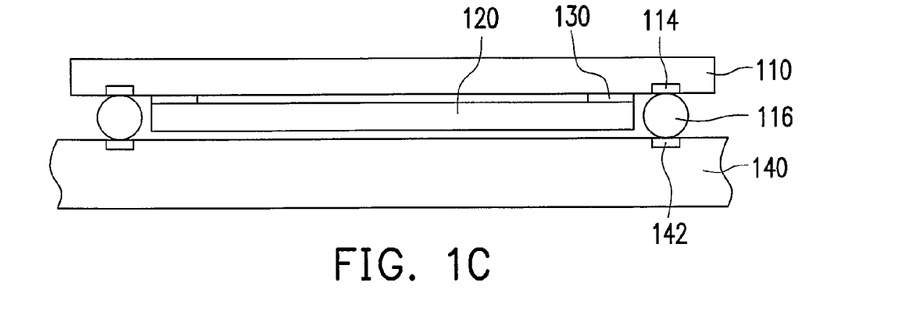
FIG. 1C is a cross-sectional view of the first chip package of FIG. 1A connected to a printed circuit board.

FIG. 1C is a cross-sectional view of the first chip package of FIG. 1A connected to a printed circuit board. Referring to FIGS. 1A, 1B, and 1C, a plurality of contacts 116 such as conductive bumps are disposed on the bond pads respectively.

The heights of the contacts 116 relative to the active surface 112 are larger than the height of the rigid cover 120 relative to the active surface 112 so that the chip package 100 can be connected to the PCB 140 via the contacts 116. The PCB 140 has a plurality of contact pads 142. The bond pads 114 of the chip package 100 are electrically connected to the contact pads 142 of the PCB 140 via the contacts 116. Further, one can control the heights of the contacts 116 relative to the active surface 112 or the height of the rigid cover 120 relative to the active surface 112 to optionally make the rigid cover 120 contact or not contact the PCB 140. For thermal dissipation or electric characteristic consideration, the cover 120 can be structurally or electrically connected to the PCB 140. In FIGS. 1A-1C, the bond pads 114 are not limited to be disposed around the circumference of the active surface 112. The bond pads can also be disposed on one side or two sides (adjacent or opposite) of the active surface.

Figure 2A:
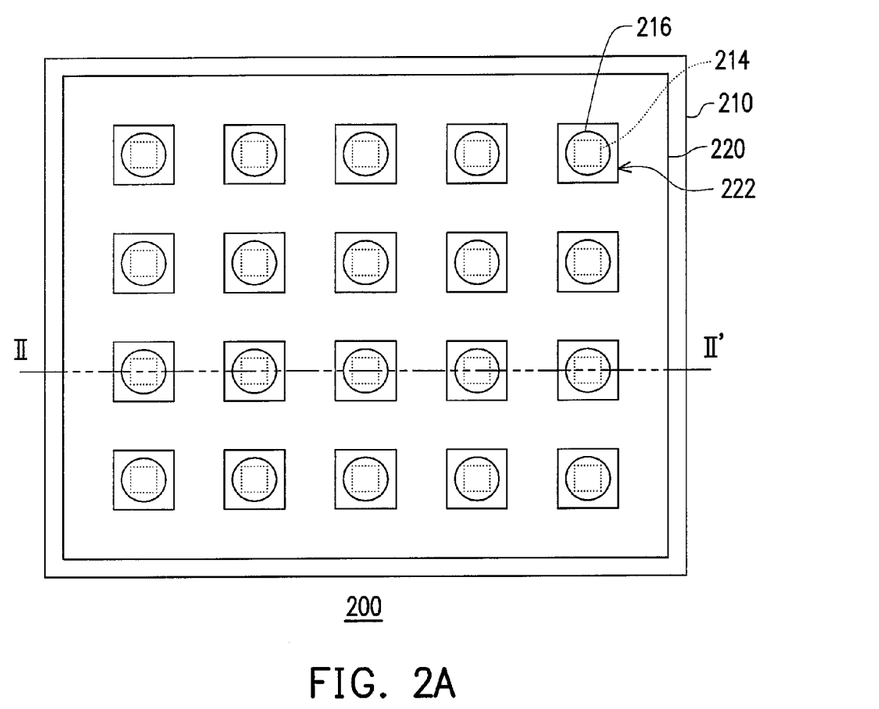
FIG. 2A is a top view of the second chip package in accordance with the first embodiment of the present invention.
Figure 2B:
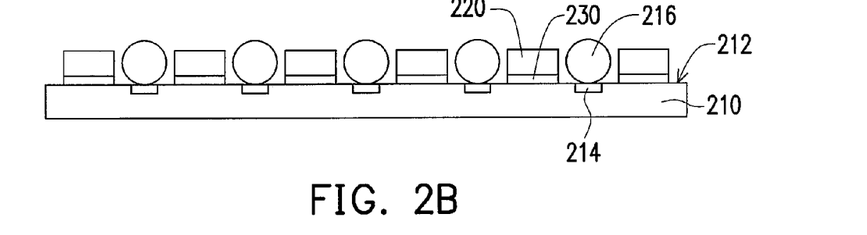
FIG. 2B is a cross-sectional view of the second chip package of FIG. 2A along II-II' line.

FIG. 2A is a top view of the second chip package in accordance with the first embodiment of the present invention. FIG. 2B is a cross-sectional view of the second chip package of FIG. 2A along II-II' line. Referring to FIGS. 2A and 2B, the chip 210 of the second chip package 200 has a plurality of bond pads 214 disposed as an area array on the active surface 212. The active surface 212 of the chip 210 has a redistribution layer (not shown), which can rearrange the bond pads 214 around the circumference of the active surface 212 with an area array. Further, the rigid cover 220 is adhered to the active surface 212 via the adhesive layer 230. The rigid cover 220 has a plurality of openings 222 corresponding to the bond pads 214 and exposing the bond pads 214.

Figure 2C:
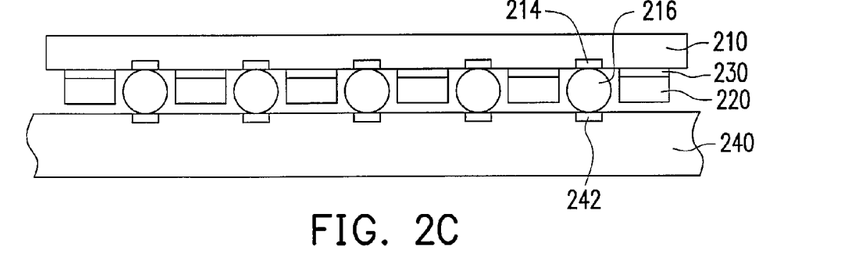
FIG. 2C is a cross-sectional view of the second chip package of FIG. 2A connected to a printed circuit board.

FIG. 2C is a cross-sectional view of the second chip package of FIG. 2A connected to a printed circuit board. A plurality of contacts 216 is disposed on the bond pads 214 respectively. The heights of the contacts 216 relative to the active. surface 212 is larger than the height of the rigid cover 220 relative to the active surface 212 so that the chip package 200 can be connected to the PCB 240 via the contacts 216. The PCB 240 has a plurality of contact pads 242. The bond pads 214 of the chip package 200 are electrically connected to the contact pads 242 of the PCB 240 via the contacts 216.

In the above first and second chip packages, the rigid covers completely cover the wafers. A plurality of contacts such as conductive bumps, is disposed on the bond pads respectively. Then the wafer is cut to obtain independent chip packages. It should be noted that although the contacts can be formed before cutting the wafer, one may also choose to form the contacts on the contact pads of the PCB. Then the chip package can be connected to the PCB via these contacts.

The second embodiment uses a plurality of connecting lines to extend the bond pads to the backside of the chip and to form the terminal pads on the backside of the chip.

FIGS. 3A-3F show top views of the progression steps of the chip packaging process in accordance with the second embodiment of the present invention.

Figure 3A:
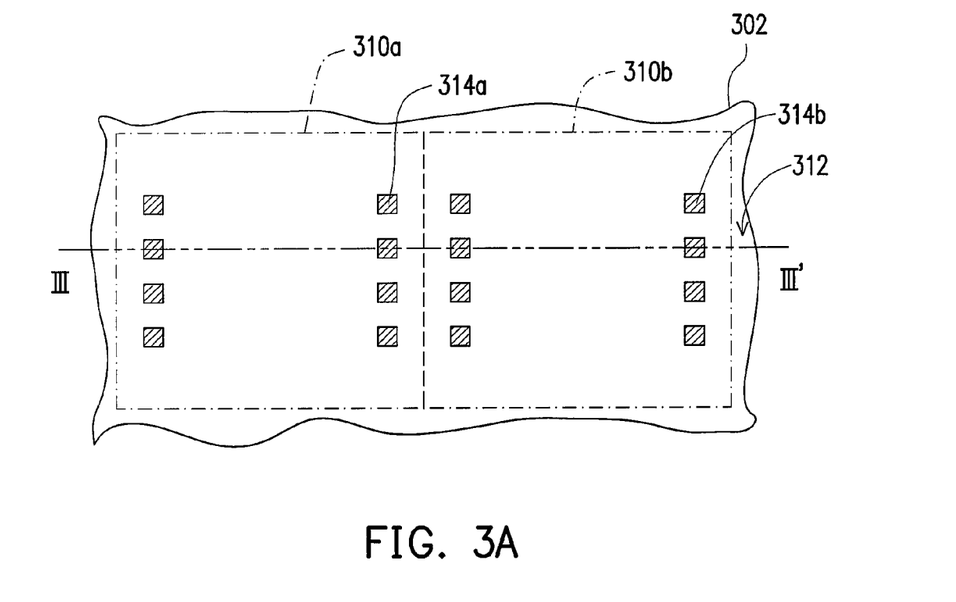
FIGS. 3A-3F show top views of the progression steps of the chip packaging process in accordance with the second embodiment of the present invention.
Figure 4A:
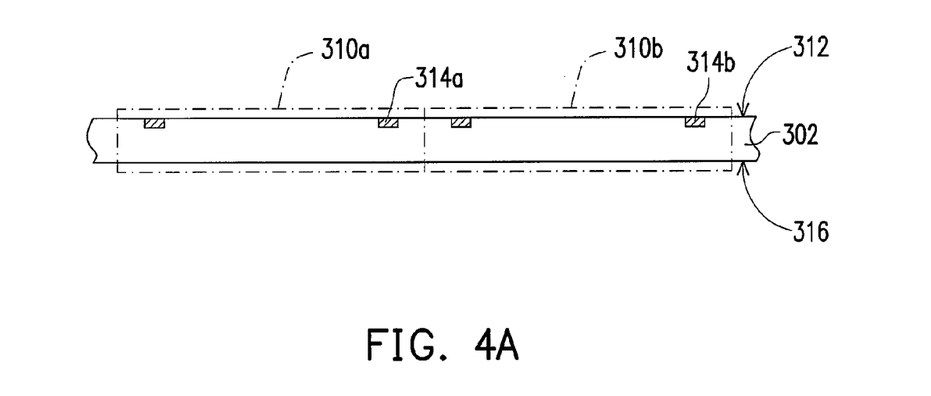
FIGS. 4A-4F show cross-sectional views of the chip packaging process of FIGS. 3A-3F along III-III' line.

FIGS. 4A-4F show the cross-sectional views of the chip packaging process of FIGS. 3A-3F along III-III' line. Referring to FIGS. 3A and 4A, a wafer 302 is provided. The wafer 302 has an active surface 312 and a backside 316 corresponding to the active surface 312. The wafer 302 has a first chip area 310a and a second chip area 310b adjacent to the first chip area 310a. The wafer 302 has a plurality of first and second bond pads 314a and 314b on the active surface 312 in the first and second chip areas 310a and 310b respectively.

Figure 3B:
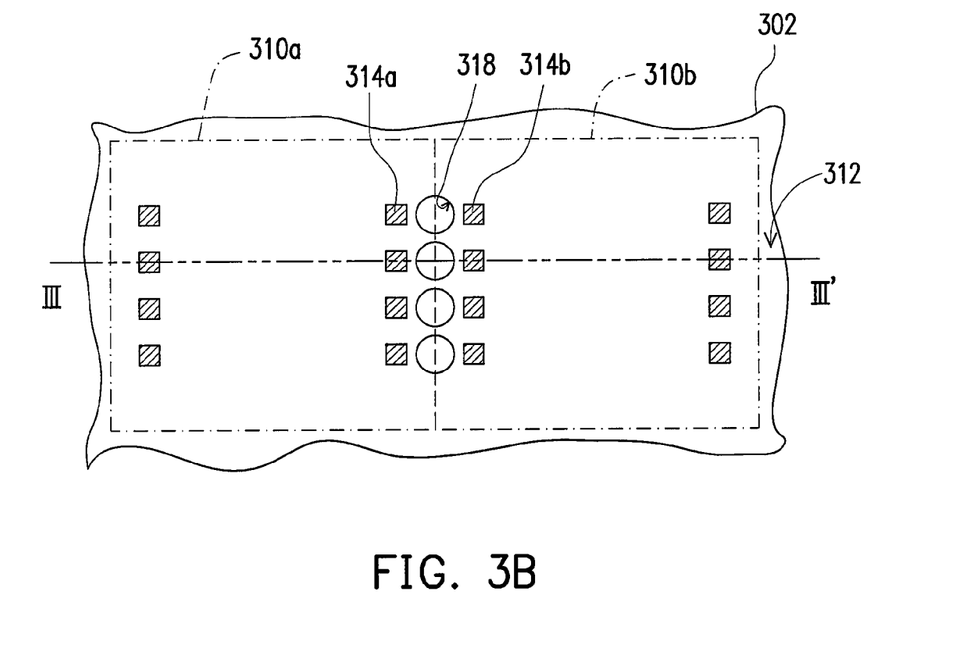
Figure 4B:
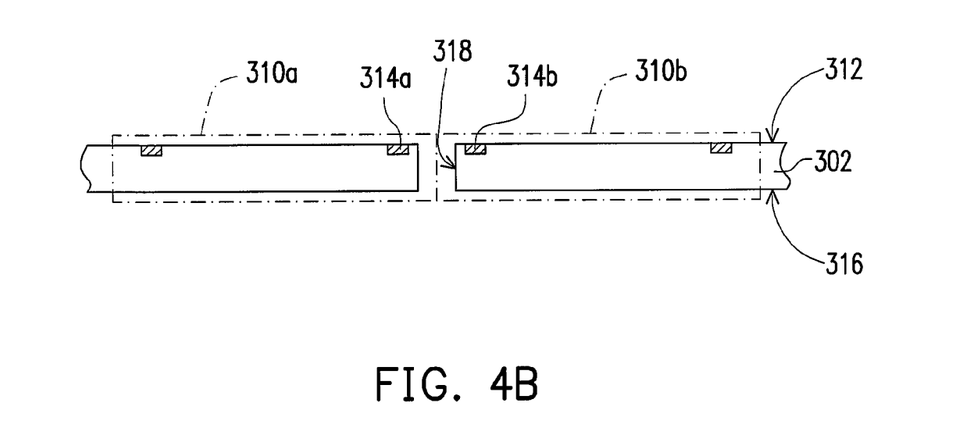

Referring to FIGS. 3B and 4B, a plurality of through holes 318 are formed on the wafer 302. The through holes 318 are through the wafer 302 by laser drilling or mechanical drilling and connect the active surface 312 and the backside 316. The through holes 318 are arranged between the first chip area 310a and the second chip area 310b.

Figure 3C:
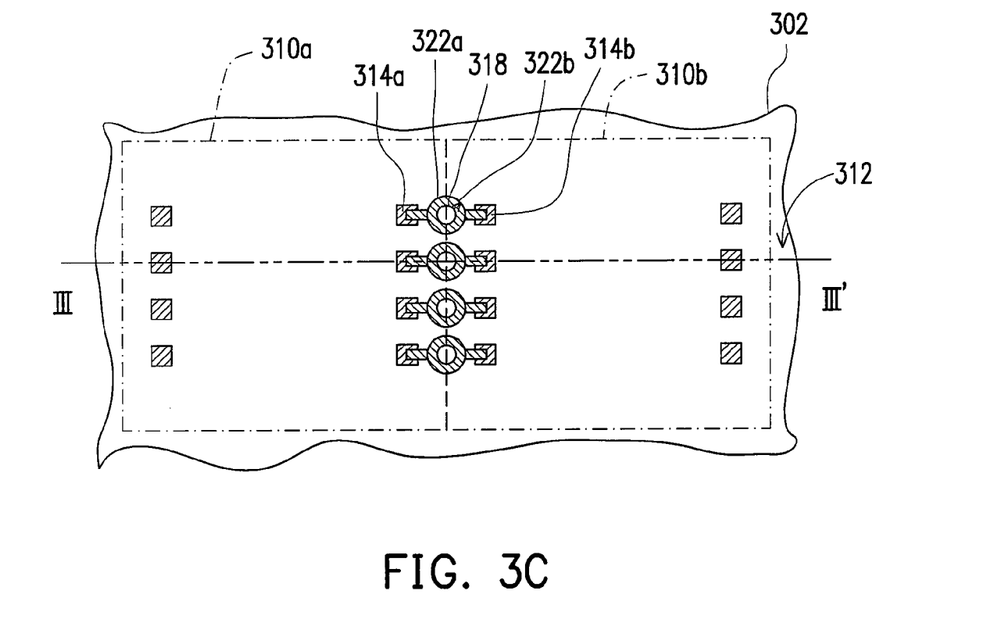
Figure 4C:
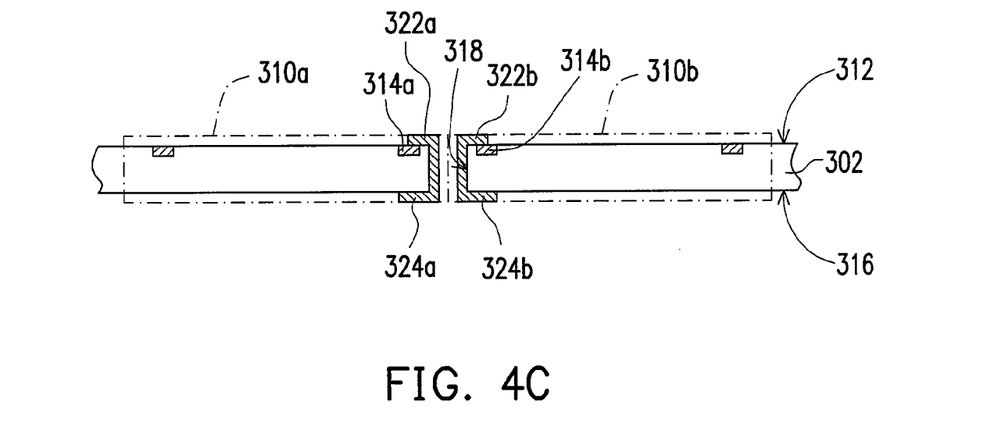

Referring to FIGS. 3C and 4C, a plurality of first and second connecting lines 322a and 322b are formed on the wafer 302 by electroplating. Each of the first connecting lines 322a has a first end through one of the through holes 318 electrically connected to one of the first bond pads 314a. Each of the first connecting lines 322a has a second end extended to the backside 316 of the first chip area 310a to form one first terminal pad 324a on the backside 316 of the first chip area 310a. Each of the second connecting lines 322b has a first end through one of the through holes 318 electrically connected to one of the second bond pads 314b. Each of the second connecting lines 322b has a second end extended to the backside 316 of the second chip area 310b to form one second terminal pad 324b on the backside 316 of the second chip area 310b. It should be noted that because the first and second connecting lines 322a and 322b are formed on the wafer 302 by electroplating, portions of the first connecting lines 322a in the through holes 318 may be connected to portions of the second connecting lines 322b in the through holes 318 respectively.

Figure 3D:
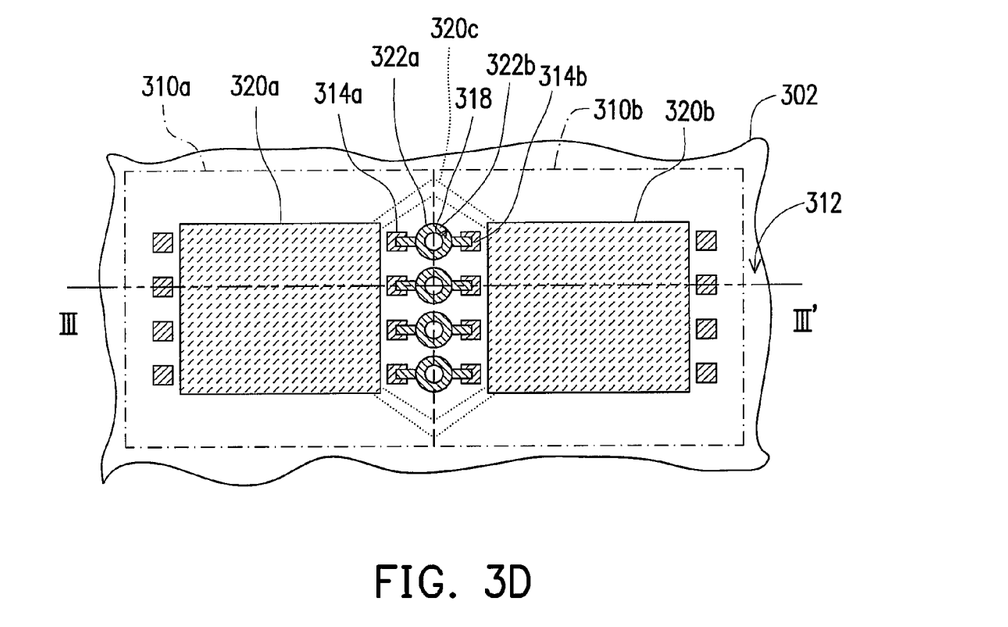
Figure 4D:
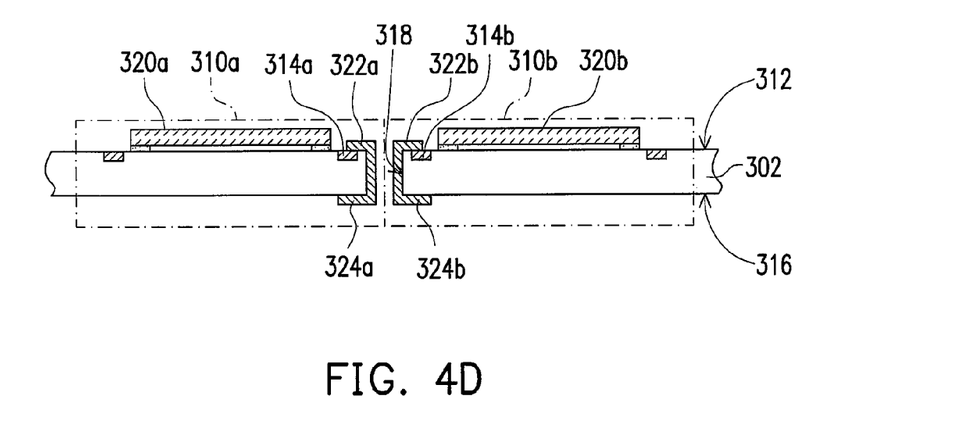

Referring to FIGS. 3D and 4D, a first rigid cover 320a and a second rigid cover 320b are disposed on the active surface 312 of the first chip area 310a and the active surface 312 of the second chip area 310b via the adhesive layers 330 respectively. For thermal dissipation or electric characteristic consideration, the first and second rigid covers 320a and 320b can be a conducting material, an insulating material, and a transparent material. Further, the chip packaging process can be a wafer level packaging process. Hence, the first and second rigid covers 320a and 320b can be a single structure. That is the first and second rigid covers 320a and 320b can be structurally connected via a connecting bar 320c or other connecting structures. Therefore, only a single action is required to dispose the first and second rigid covers 320a and 320b on the active surface 312.

Figure 3E:
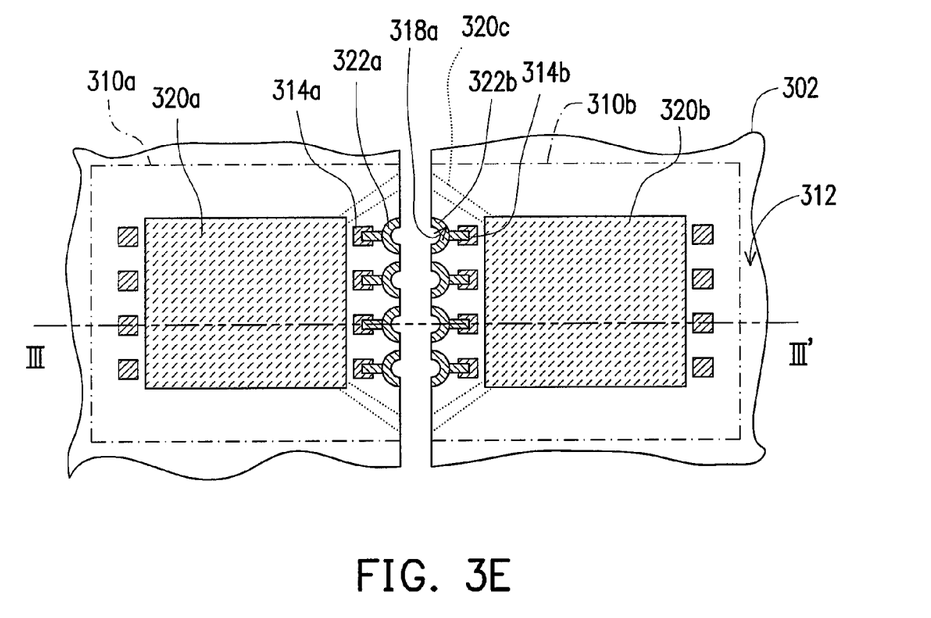
Figure 4E:
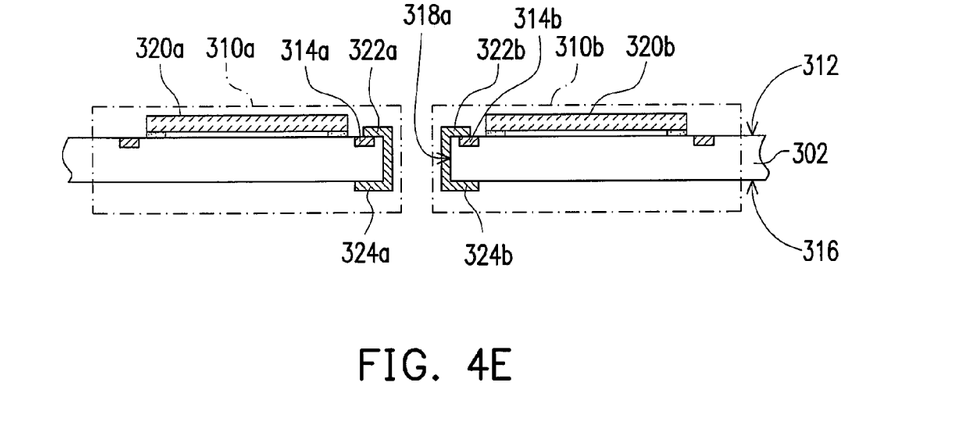

Referring to FIGS. 3E and 4E, the wafer 302 is cut along an area between the first and second chip areas 310a and 310b by mechanical or laser cutting. The portions of the first connecting lines 322a in the through holes 318 and the portions of the second connecting lines 322b in the through holes 318 are also cut. Hence, the lateral side of the chip 310 has a plurality of concave surfaces 318a (i.e., a half of the through holes 318). The portions of the first connecting lines 322a in the through holes 318 and the portions of the second connecting lines 322b in the through holes 318 are disposed on the concave surfaces 318a to electrically connect the bond pads 314 and the terminal pads 324. Further, when the first and second rigid covers 320a and 320b is a single structure, the connecting bars 320c will be cut to separate the first and second rigid covers 320a and 320b.

Figure 3F:
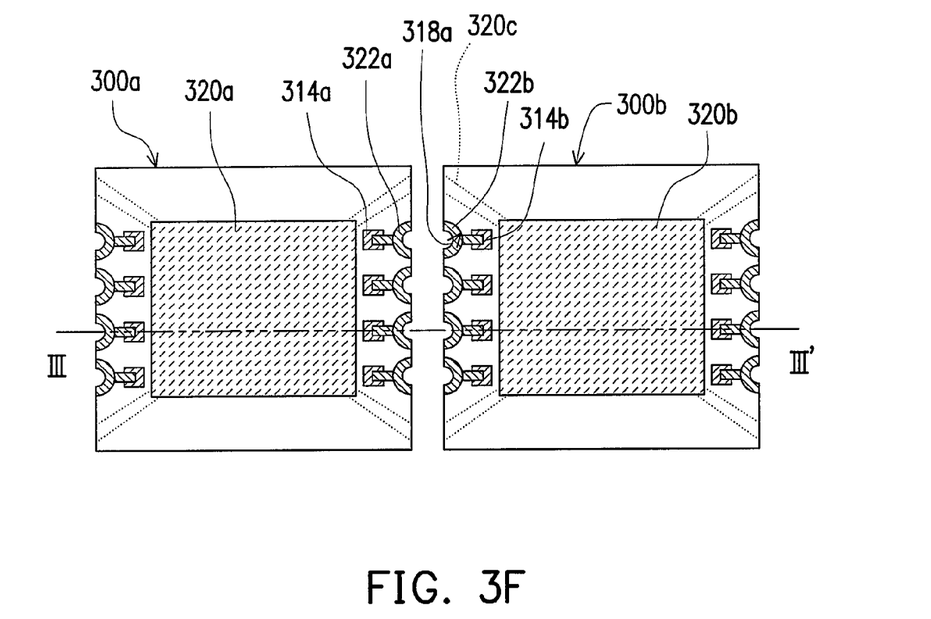
Figure 4F:
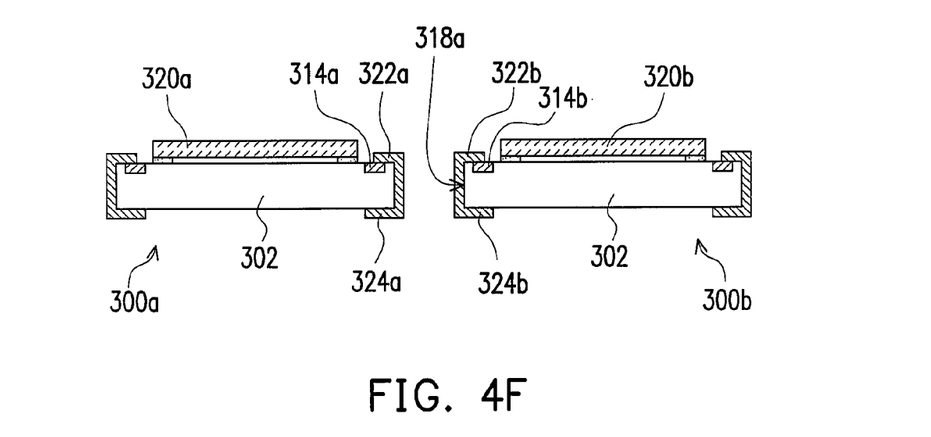

Referring to FIGS. 3F and 4F, the first chip area 310a and the second chip area 310b are separated from the wafer 302 by mechanical or laser cutting. Hence, the first chip area 310a and the first rigid cover 320a become a first chip package 300a, the second chip area 310b and the second rigid cover 320b become a second chip package 300b.

Figure 5:
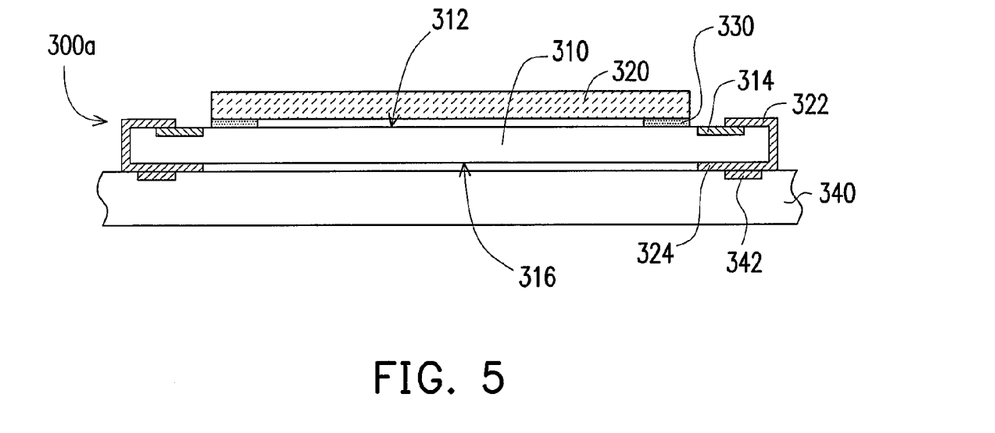
FIG. 5 is a cross-sectional view of the chip package of FIG. 3F connected to a printed circuit board.

FIG. 5 is a cross-sectional view of the chip package of FIG. 3F connected to a printed circuit board. The chip package 300 includes a chip 310, a rigid cover 320, and an adhesive layer 330. The chip 310 has a rectangular shape and an active surface 312 and a plurality of bond pads 314. The bond pads 314 are disposed on the circumference of the active surface 312. A plurality of connecting lines 322 extends the bond pads 314 to the backside 316 of the chip 310 to form a plurality of the terminal pads 324. The terminal pads 324 can be connected to the contact pads 342 of the PCB 340 via a pre-solder, ACP or ACF (not shown).

Figure 6:
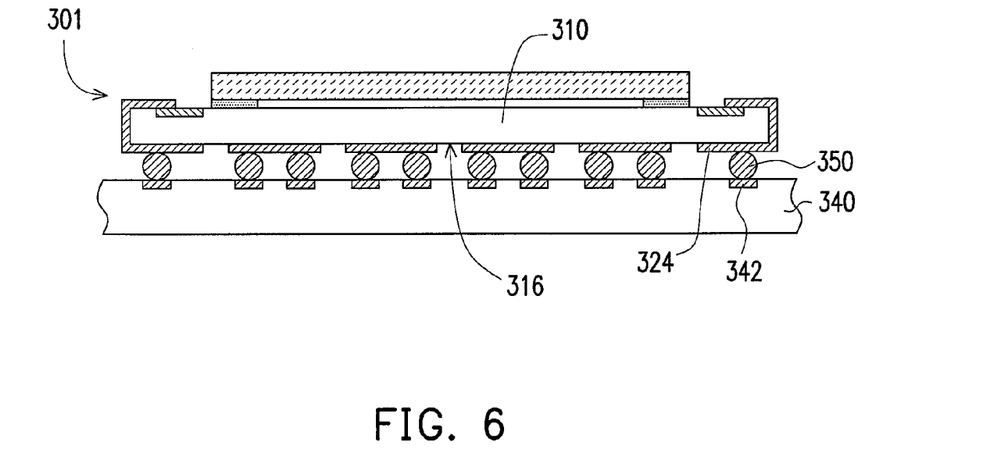
FIG. 6 is a cross-sectional view of another chip package connected to a printed circuit board in accordance with a second embodiment of the present invention.

FIG. 6 is the cross-sectional view of another chip package connected to a printed circuit board in accordance with the second embodiment of the present invention. Compared to FIG. 5, the chip 310 of the chip package 300 has a plurality of terminal pads 324 disposed as an area array on backside 316 of the chip 310. These terminal pads 324 can be connected to the contact pads 342 of the PCB 340 via the contacts 350 such as conductive bumps.

The second embodiment uses a plurality of connecting lines to extend the bond pads to the backside of the chip and to form the terminal pads on the backside of the chip. Hence, when the chip is connected to the PCB, the active surface of the chip can be exposed. When the rigid cover is a transparent material, the chip package in the second embodiment can be applied in optical-electronic devices such as CMOS image sensor (CIS) and solar cell, or bio-chip.

In brief, the chip package and the process thereof dispose a rigid cover on the active surface of the chip to protect the active surface of the chip and enhance the structural strength of the chip package. Further, if the material of the rigid cover is a thermally conductive material such as Cu or Al alloy, the heat-spread ability of the chip package can be enhanced. If the rigid cover is made of an electrical conductive material and electrically connected to the ground of the chip package, the electromagnetic interference (EMI) to the chip package can be reduced. If the rigid cover is a transparent material, the chip package can be applied in optic-electric or bio devices. In addition, the chip packaging process can form a plurality of the terminal pads on the backside of the chip so that the chip package can be connected to the PCB or substrate via these terminal pads.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A chip packaging process, comprising:
    providing a wafer, said wafer having an active surface and a backside corresponding to said active surface, said wafer having a first chip area and a second chip area adjacent to said first chip area, said wafer having a plurality of first and second bond pads on said active surface in said first and second chip areas respectively;
    forming a plurality of through holes on said wafer, said plurality of through holes passing through said wafer and connecting said active surface and said backside, said through holes being arranged between said first chip area and said second chip area;
    forming a plurality of connecting lines on peripheral surfaces of said through holes, wherein each of said connecting lines has a first end portion extending on said active surface and electrically connecting to one of said first bond pads and one of said second bond pads; and
    disposing a first rigid cover and a second rigid cover on said active surface of said first chip area and said active surface of said second chip area respectively, wherein said first rigid cover and said second rigid cover respectively have a plurality of rows and columns of openings exposing the corresponding first bond pads and the corresponding; second bond pads.

2. The process of claim 1, further comprising:
    cutting said wafer along an area between said first and second chip areas and cutting said connecting lines into first connecting lines and second connecting lines in said through holes; and
    separating said first chip area and said second chip area from said wafer, said first chip area and said first rigid cover being a first chip package, said second chip area and said second rigid cover being a second chip package.

3. The process of claim 1, wherein said first rigid cover is adhered to said active surface.

4. The process of claim 1, wherein a periphery of said first rigid cover is adhered to said active surface.

5. The process of claim 1 wherein a material of said first rigid cover includes a conducting material, an insulating material, or a transparent material.

6. The process of claim 2, in said step of forming said connecting lines, wherein each of said connecting lines has a second end portion extending on the backside.

7. The process of claim 6, wherein in the step of cutting said wafer, each of said second end portions is cut into a first terminal pad and a second terminal pad corresponding to said first chip area and said second chip area, respectively.

8. The process of claim 7, wherein said first terminal pads and said second terminal pads are disposed as an area array, respectively.

9. The process of claim 2, wherein said first and second rigid covers are structurally connected, said step of cutting said wafer comprises cutting said structural connection of said first and second rigid covers to separate said first and second rigid covers.

10. The process of claim 1, wherein said connecting lines are formed by electroplating.

* * * * *